United States Patent
Gad et al.

(10) Patent No.: US 12,301,254 B2
(45) Date of Patent: May 13, 2025

(54) EARLY STOPPING OF BIT-FLIP LOW DENSITY PARITY CHECK DECODING BASED ON SYNDROME WEIGHT

(71) Applicant: Micron Technology, Inc., Boise, ID (US)

(72) Inventors: Eyal En Gad, Santa Clara, CA (US); Mustafa N. Kaynak, San Diego, CA (US); Yoav Weinberg, Toronto (CA); Zhengang Chen, San Jose, CA (US); Sivagnanam Parthasarathy, Carlsbad, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/829,913

(22) Filed: Jun. 1, 2022

(65) Prior Publication Data

US 2023/0396271 A1     Dec. 7, 2023

(51) Int. Cl.
    *H03M 13/11*     (2006.01)

(52) U.S. Cl.
    CPC .... *H03M 13/1128* (2013.01); *H03M 13/1108* (2013.01); *H03M 13/1117* (2013.01); *H03M 13/1151* (2013.01)

(58) Field of Classification Search
    CPC .......... H03M 13/1117; H03M 13/1108; H03M 13/1128; H03M 13/1151; H03M 13/1111; H03M 13/3707; H03M 13/3715
See application file for complete search history.

(56) References Cited

U.S. PATENT DOCUMENTS

| | | | |
|---|---|---|---|
| 9,467,171 B1* | 10/2016 | Varnica | H03M 13/6566 |
| 9,564,931 B1* | 2/2017 | Nguyen | H03M 13/116 |
| 9,755,665 B1* | 9/2017 | Chilappagari | H03M 13/1105 |
| 9,966,972 B1* | 5/2018 | Zhong | H04L 1/0051 |
| 10,797,728 B1* | 10/2020 | Varnica | H03M 13/3707 |
| 11,068,342 B1* | 7/2021 | Alrod | G06F 11/1048 |
| 11,323,138 B1* | 5/2022 | Shin | H03M 13/45 |
| 11,556,274 B1* | 1/2023 | Avraham | G06F 3/061 |
| 2011/0219284 A1* | 9/2011 | Uchikawa | H03M 13/05 714/763 |
| 2012/0297267 A1* | 11/2012 | Chinnici | H03M 13/3738 714/755 |
| 2015/0249471 A1* | 9/2015 | Yen | H03M 13/6502 714/755 |
| 2017/0117925 A1* | 4/2017 | Achtenberg | H03M 13/114 |
| 2017/0123902 A1* | 5/2017 | Ravimohan | G11C 29/52 |
| 2018/0343082 A1* | 11/2018 | Xiong | H04L 1/0051 |
| 2020/0052716 A1* | 2/2020 | Kim | H03M 13/1111 |
| 2020/0252079 A1* | 8/2020 | Wang | H03M 13/1125 |

(Continued)

*Primary Examiner* — Steve N Nguyen

(74) *Attorney, Agent, or Firm* — LOWENSTEIN SANDLER LLP

(57) ABSTRACT

A processing device in a memory sub-system determines a syndrome weight for a sense word read from a memory device and determines whether the syndrome weight for the sense word satisfies a threshold criterion. Responsive to the syndrome weight for the sense word satisfying a respective threshold criterion associated with a next iteration of a first decoding operation, bypassing the first decoding operation and initiating a second decoding operation for the sense word, wherein the second decoding operation has a higher error correction capability than the first decoding operation.

18 Claims, 6 Drawing Sheets

(56) References Cited

U.S. PATENT DOCUMENTS

| | | | | |
|---|---|---|---|---|
| 2020/0387427 A1* | 12/2020 | Mekhanik | ............... | G06F 3/064 |
| 2021/0126657 A1* | 4/2021 | Tanakamaru | ....... | H03M 13/353 |
| 2021/0175900 A1* | 6/2021 | Kuo | ................... | H03M 13/1148 |
| 2021/0184699 A1* | 6/2021 | Kwak | ............... | H03M 13/1575 |
| 2022/0149870 A1* | 5/2022 | Avraham | .......... | H03M 13/3715 |
| 2023/0037996 A1* | 2/2023 | Kim | ....................... | G11C 15/04 |

* cited by examiner

| | SWB 0 | SWB 1 | SWB 2 | SWB 3 | SWB 4 | SWB 5 | SWB 6 | SWB 7 | SYNDROME 320 |
|---|---|---|---|---|---|---|---|---|---|
| SB0 | 1 | 0 | 1 | 1 | 0 | 0 | 1 | 0 | 0 |
| SB1 | 1 | 1 | 1 | 0 | 1 | 0 | 0 | 0 | 0 |
| SB2 | 1 | 1 | 1 | 0 | 0 | 1 | 0 | 0 | 1 |
| SB3 | 1 | 1 | 1 | 1 | 0 | 0 | 1 | 0 | 1 |
| SB4 | 0 | 0 | 0 | 1 | 1 | 1 | 1 | 1 | 0 |
| SB5 | 0 | 1 | 1 | 1 | 1 | 1 | 1 | 0 | 1 |
| SB6 | 0 | 0 | 0 | 1 | 1 | 0 | 0 | 1 | 0 |
| SB7 | 0 | 0 | 0 | 1 | 0 | 1 | 1 | 1 | 1 |

SENSE WORD 310

EARLY STOPPING OF BIT-FLIP LOW DENSITY PARITY CHECK DECODING BASED ON SYNDROME WEIGHT

TECHNICAL FIELD

Embodiments of the disclosure relate generally to memory sub-systems, and more specifically, relate to early stopping of bit-flip low density parity check (LDPC) decoding based on syndrome weight in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 3 is a diagram illustrating a sense word-syndrome matrix used for configuring iterative error correction parameters in accordance with some embodiments of the present disclosure.

DETAILED DESCRIPTION

Figure 1A:
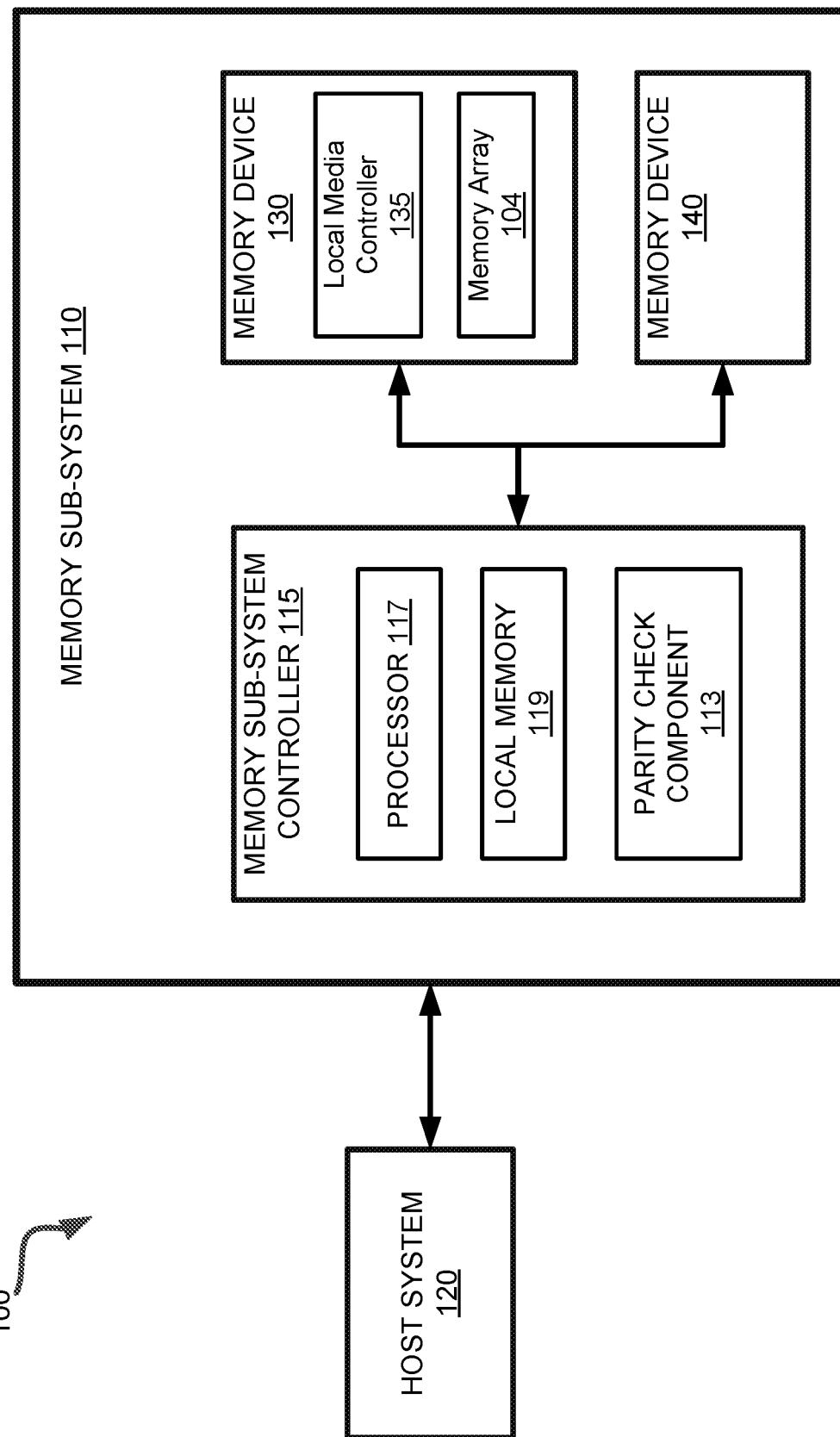
FIG. 1A illustrates an example computing system that includes a memory sub-system in accordance with some embodiments of the present disclosure.

Aspects of the present disclosure are directed to early stopping of bit-flip low density parity check (LDPC) decoding based on syndrome weight in a memory sub-system. A memory sub-system can be a storage device, a memory module, or a hybrid of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NAND memory, such as 3D flash NAND memory, offers storage in the form of compact, high density configurations. A non-volatile memory device is a package of one or more dice, each including one or more planes. For some types of non-volatile memory devices (e.g., NAND memory), each plane includes of a set of physical blocks. Each block includes of a set of pages. Each page includes of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are formed onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane.

One example of a memory sub-system is a solid-state drive (SSD) that includes one or more non-volatile memory devices and a memory sub-system controller to manage the non-volatile memory devices. The memory sub-system controller can encode data into a format for storage at the memory device(s). For example, a class of error detection and correcting codes (ECC), such as low density parity check (LDPC) codes, can be used to encode the data. LDPC codes are capacity-approaching codes, which means that practical constructions exist which allow the error threshold to be set very close to a theoretical maximum. This error threshold defines an upper bound for errors in the data, up to which the probability of lost information can be made as small as desired. LDPC codes are reliable and highly efficient, making them useful in bandwidth-constrained applications. For example, encoded data written to physical memory cells of a memory device can be referred to as a codeword. The data read from the cells, which might include errors and differ from the codeword, can be referred to as a sense word. The sense word can include one or more of user data, error correcting code, metadata, or other information.

In performing error correcting code operations, including, as part of a read operation, encoded data stored on the memory device can be transmitted from the memory device to the memory sub-system controller. The memory sub-system controller can perform decoding operations to decode the encoded data into the original sequence of bits that were encoded for storage on the memory device. A number of bits of the decoded data received by the memory sub-system controller may have been flipped due to noise, interference, distortion, bit synchronization errors, or errors from the media itself (both intrinsic and extrinsic). For example, a bit that may have originally been stored as a 0 may be flipped to a 1 or vice versa.

Many memory sub-systems perform error correcting code operations to attempt to correct bit flip errors in a sense word read from the memory device. For example, a memory sub-system can perform error correcting code operations on stored data to detect and correct errors in the encoded data. In many cases, the data is decoded using an iterative process.

Segments of a data array can be decoded to produce a corresponding string of bits (e.g., a sense word).

Generally, error correction in a memory sub-system is a time and resource intensive process. Certain memory sub-systems utilize multiple decoders to identify and correct the errors. For example, a given memory sub-system might include a bit flip decoder and a Min-Sum decoder. The bit flip decoder utilizes a number of parity check equations, each applicable to a subset of the bits of the sense word, which function together to identify bit flip errors in the sense word. Such a bit flip decoder consumes a low amount of power but has a relatively weak error correction capability. In most cases the correction capability of the bit flip decoder is sufficient, and its low power consumption can be very beneficial. In the less common cases, such as before the end of life of the memory device when the number of errors is very high, the bit flip decoder can fail to correct all of the errors and will not successfully decode the data. In many memory sub-systems, the memory sub-system controller will start any decoding operation with the bit flip decoder because of its high efficiency. If all of the errors are not able to be corrected after a certain amount of time (e.g., a fixed number of iterations), the memory sub-system controller can then activate the Min-Sum decoder. Such a Min-Sum decoder is less power efficient than the bit flip decoder, but has a higher error correction capability and can correct more errors.

The bit flip decoder can begin decoding by calculating a syndrome weight of a received sense word. The syndrome is the product of a parity check matrix with the decoded word (under the used finite field, typically binary), and the weight is the number of non-zero symbols in the syndrome. Thus, the syndrome weight is positively correlated with the number of errors in the decoded word. Therefore, when the syndrome weight is high, it is likely that the number of errors is high, and therefore that bit flip decoding will fail. Although the syndrome weight can be determined early on in the decoding process, most memory sub-systems perform the entire bit flip decoding process (e.g., for all of the fixed number of iterations) before switching to Min-Sum decoding, regardless of the syndrome weight.

Aspects of the present disclosure address the above and other deficiencies by providing early stopping of bit-flip low density parity check (LDPC) decoding based on syndrome weight in a memory sub-system. In one embodiment, before each iteration of a bit flip decoding process is performed, a parity check component in the memory sub-system controller can determine the current syndrome weight (e.g., the number of non-zero symbols in the syndrome) and can determine whether the current syndrome weight satisfies a threshold criterion associated with the given iteration. In one embodiment, the threshold criterion is satisfied if the current syndrome weight is greater than or equal to a threshold number associated with the given iteration. As the syndrome weight is representative of the number of errors in the sense word, if the syndrome weight satisfies the threshold criterion, this is an indication that the number of errors in the sense word is high, and likely too high to be successfully corrected, even after the maximum number of iterations of the bit flip decoding process. Accordingly, upon determining that the current syndrome weight satisfies the threshold criterion, the parity check component can end the bit flip decoding process without completing the remaining iterations, and initiate a second decoding process, such as Min-Sum decoding, for example. In one embodiment, the threshold number associated with each iteration decreases, as the number of iterations approaches the maximum number. The threshold number associated with each iteration can be selected according to a number of factors, such as in order to minimize the expected decoding time, to minimize power consumption and load on the decoders, to minimize an expected latency, or a combination of these and/or other considerations.

Advantages of the approach described herein include, but are not limited to, improved performance in the memory sub-system. For example, by using the syndrome weight to determine to end the bit flip decoding process before the maximum number of iterations has been reached, both time and energy savings can be realized during the decoding operations. In certain embodiments, the memory sub-system can avoid performing at least a portion of the bit flip decoding process knowing that said process is unlikely to be successful, and can initiate a second decoding process sooner. This reduces the time and complexity of the parity check and error correction processes, thereby freeing resources of the memory sub-system controller to perform other operations.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., one or more memory device(s) 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., the one or more memory device(s) 130) when the memory sub-system 110 is coupled with the host system 120 by the PCIe interface. The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device(s) 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory device(s) 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory device(s) 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device(s) 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory device(s) 130. The memory sub-system controller 115 can further include host interface circuitry to communicate with the host system 120 via the physical host interface. The host interface circuitry can convert the commands received from the host system into command instructions to access the memory device(s) 130 as well as convert responses associated with the memory device(s) 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device(s) 130.

In some embodiments, the memory device(s) 130 include local media controllers 135 that operate in conjunction with memory sub-system controller 115 to execute operations on one or more memory cells of the memory device(s) 130. An external controller (e.g., memory sub-system controller 115) can externally manage the memory device 130 (e.g., perform media management operations on the memory device(s) 130). In some embodiments, a memory device 130 is a managed memory device, which is a raw memory device (e.g., memory array 104) having control logic (e.g., local controller 135) for media management within the same memory device package. An example of a managed memory device is a managed NAND (MNAND) device. Memory device(s) 130, for example, can each represent a single die having some control logic (e.g., local media controller 135) embodied thereon. In some embodiments, one or more components of memory sub-system 110 can be omitted.

In one embodiment, the memory sub-system 110 includes a parity check component 113 that can use low-density parity check (LDPC) codes to identify and correct errors in data stored on memory device 130. In one embodiment, parity check component 113 includes multiple separate decoders, such as a bit flip decoder and a Min-Sum decoder. According to the scheme described herein, parity check component 113 can identify which of the decoders to employ in response to a request to read data from memory device 130 (e.g., a request received from host system 120). In one embodiment, responsive to the syndrome for a sense word read from memory devices 130 not satisfying a codeword criterion (e.g., one or more parity check equation results being in an unsatisfied state), parity check component 113 can perform an iterative LDPC correction process using the bit flip decoder. In one embodiment, parity check component 113 determines whether the syndrome weight satisfies a threshold criterion associated with a given iteration. In response to determining that the current syndrome weight does not satisfy the threshold criterion, parity check component 113 can continue the bit flip decoding process and proceed to a next iteration. In response to determining that the current syndrome weight satisfies the threshold criterion, however, parity check component 113 can end the bit flip decoding process without completing the remaining iterations, and initiate a second decoding process, such as Min-Sum decoding, for example. Further details with regards to the operations of parity check component 113 are described below.

Figure 1B:
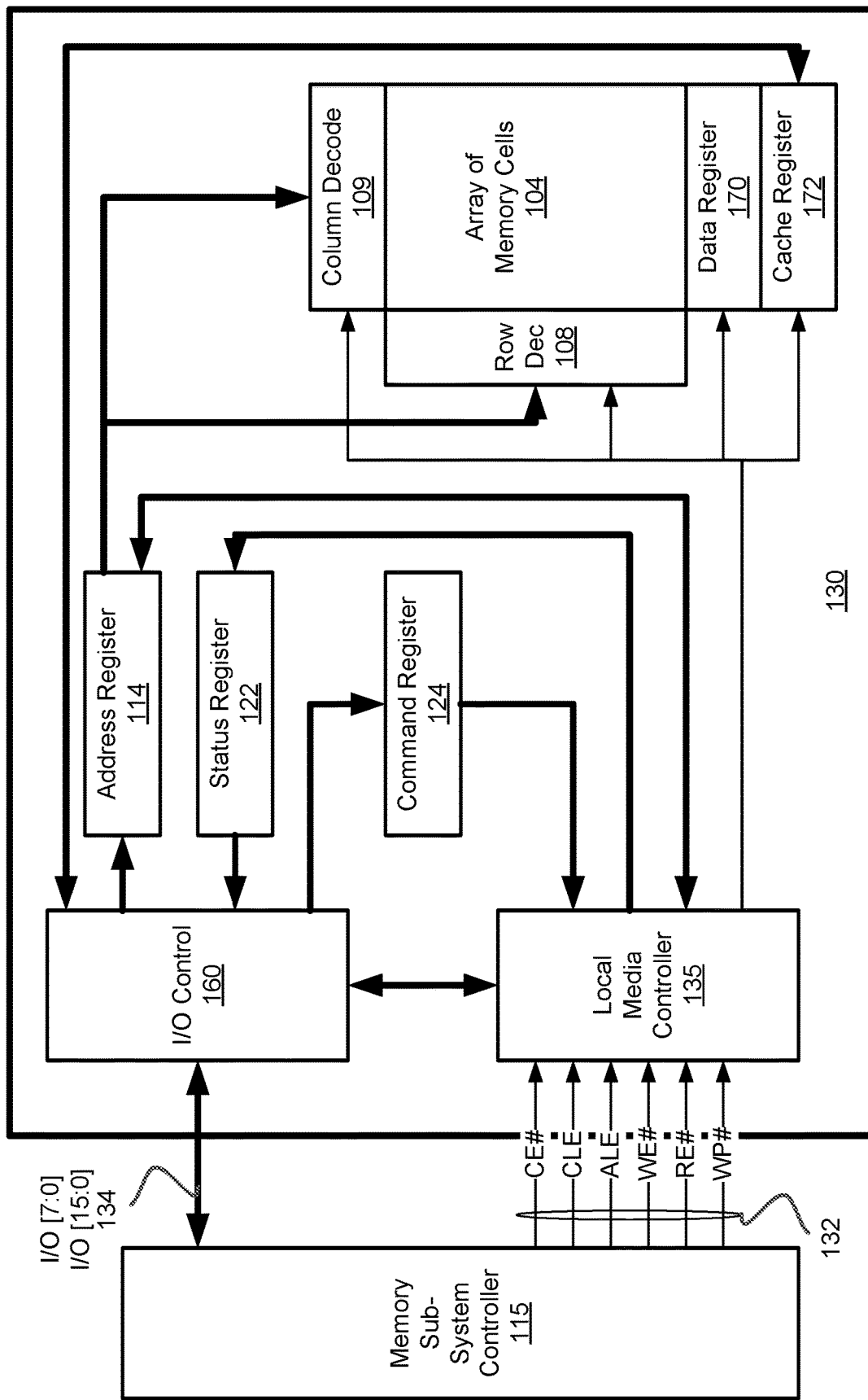
FIG. 1B is a block diagram of memory device(s) in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 109 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 109 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 109 to control the row decode circuitry 108 and column decode circuitry 109 in response to the addresses.

The local media controller 135 is also in communication with a cache register 172. Cache register 172 latches data, either incoming or outgoing, as directed by the local media controller 135 to temporarily store data while the array of memory cells 104 is busy writing or reading, respectively, other data. During a program operation (e.g., write operation), data may be passed from the cache register 172 to the data register 170 for transfer to the array of memory cells 104; then new data may be latched in the cache register 172 from the I/O control circuitry 160. During a read operation, data may be passed from the cache register 172 to the I/O control circuitry 160 for output to the memory sub-system controller 115; then new data may be passed from the data register 170 to the cache register 172. The cache register 172 and/or the data register 170 may form (e.g., may form a portion of) a page buffer of the memory device 130. A page buffer may further include sensing devices (not shown in FIG. 1B) to sense a data state of a memory cell of the array of memory cells 104, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 236 and outputs data to the memory sub-system controller 115 over I/O bus 236.

For example, the commands may be received over input/output (I/O) pins [7:0] of I/O bus 236 at I/O control circuitry 160 and may then be written into command register 124. The addresses may be received over input/output (I/O) pins [7:0] of I/O bus 236 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 172. The data may be subsequently written into data register 170 for programming the array of memory cells 104.

In an embodiment, cache register 172 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2:
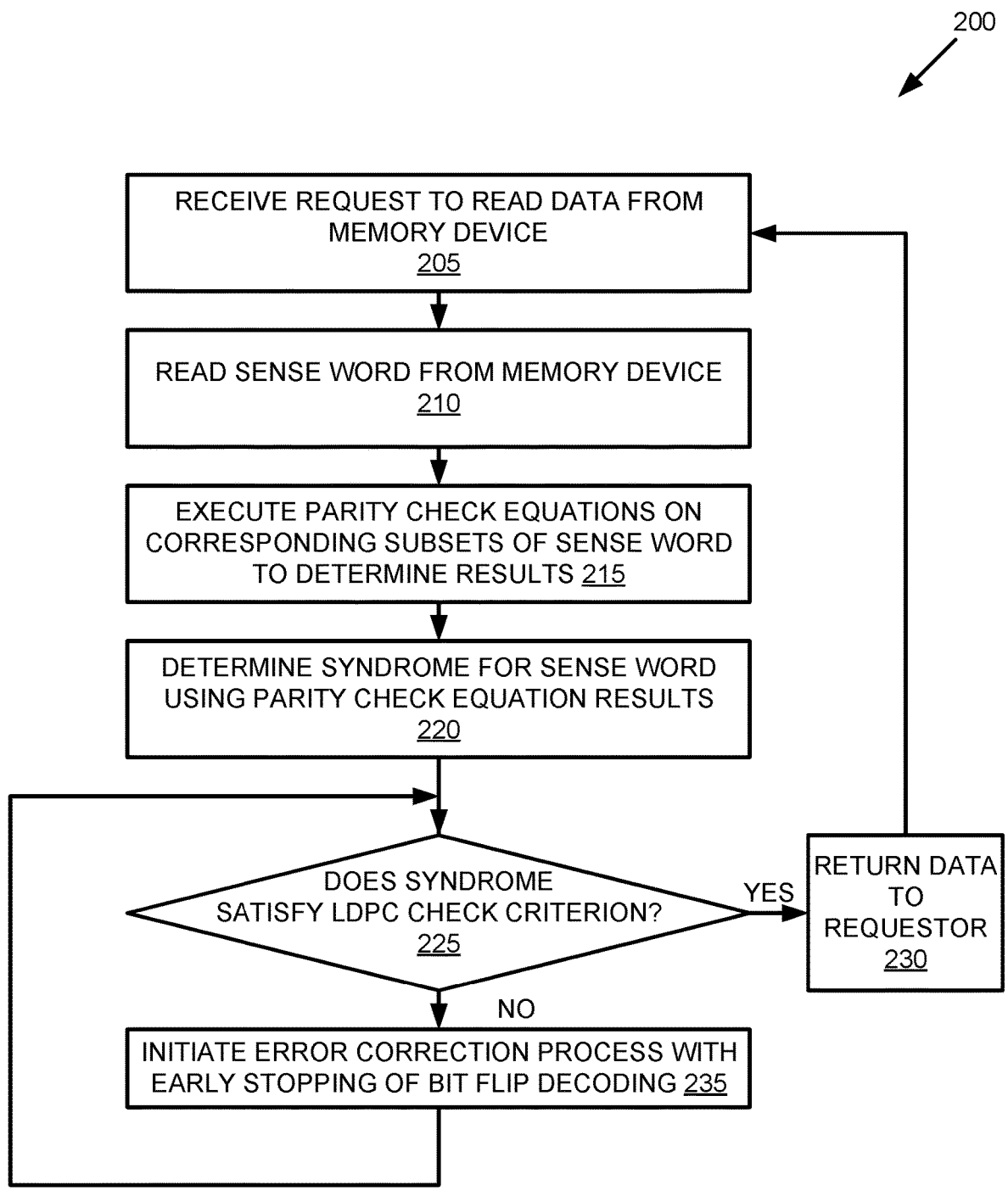
FIG. 2 is a flow diagram of an example method of initiating error correction operations in a memory sub-system in accordance with some embodiments of the present disclosure.

FIG. 2 is a flow diagram of an example method of initiating error correction operations in a memory sub-system in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by parity check component 113 of FIG. 1A. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 205, a request is received. For example, the processing logic (e.g., parity check component) receives, from a requestor, a request to read data from a memory device, such as memory device 130. In one embodiment, memory sub-system controller 115 receives the request from host system 120 or from some other component connected to or within memory sub-system 110. The request may identify data to be read from memory device 130 of memory sub-system 110.

At operation 210, data is read. For example, the processing logic reads a sense word from the memory device 130. In one embodiment, the sense word includes a sequence of bits representing the data requested at operation 205. In one embodiment, parity check component 113 identifies a physical address in memory device 130 where the requested data is stored, reads the sense word from memory device 130, and temporarily stores the sense word in a buffer or other storage location while parity check and/or error correction processes can be performed. An example sense word 310 is shown in FIG. 3. Sense word 310 is illustrated as including a sequence of eight sense word bits (i.e., SWB0-SWB7), although it should be understood that this is merely an example used for illustrative purposes. In other embodiments, the sense word can include any number of bits, such as several thousand bits (e.g., $36k$ bits).

At operation 215, one or more equations are executed. For example, the processing logic executes a number of parity check equations on corresponding subsets of the sense word. In one embodiment, each of the parity check equations corresponds to a different subset of the bits of the sense word, although different subsets can share one or more bits. For example, in one embodiment, a subset can include 40 bits out of the $36k$ bits in the sense word. There could be, for example, several thousand (e.g., $3k$) parity check equations each configured to operate on a different subset of 40 bits. Each parity check equation generates a parity check equation result which indicates whether a number of bits set to a value of '1' in the corresponding subset of the sense word is even or odd. In one embodiment, if the number of bits set to a value of '1' in the corresponding subset is even, the parity check equation result is said to be in a satisfied state and if the number of bits set to a value of '1' in the corresponding subset is odd, the parity check equation result is said to be in an unsatisfied state. In another embodiment, these values (i.e., logic states) can be reversed. Since any one bit of the sense word can be part of multiple different subsets, that bit can contribute to or be associated with multiple parity check equation results. In one embodiment, each bit of the sense word is part of the same number of subsets used by the parity check equations (e.g., 4 subsets).

At operation 220, a syndrome is determined. For example, the processing logic determines a syndrome for the sense word using the determined parity check equation results. In one embodiment, parity check component 113 logically combines the parity check equation results to determine the syndrome, such as by appending or concatenating the parity check equation results. An example syndrome 320 is shown in FIG. 3. Syndrome 320 is illustrated as including a sequence of eight syndrome bits (i.e., SB0-SB7), although it should be understood that this is merely an example used for illustrative purposes. In other embodiments, the syndrome can include any number of bits, such as several thousand bits (e.g., $3k$ bits).

FIG. 3 is a block diagram illustrating a sense word-syndrome matrix 300 used for configuring iterative error correction parameters in accordance with some embodiments of the present disclosure. As described above, sense word 310 includes a number of bits read from a memory device and syndrome 320 includes a number of bits representing parity check equation results. In the illustrated example, there are eight parity check equations each corresponding to a different subset of the bits of sense word 310. For example, a first subset represented by SB0 includes SWB0, SWB1, SWB2, and SWB4. A second subset represented by SB1 includes SWB0, SWB1, SWB2, and SWB5. A third subset represented by SB2 includes SWB0, SWB1, SWB2, and SWB6. There are additional subsets represented by each bit of syndrome 320. In the matrix 300, a value of '1' can indicate that a given bit of sense word 310 is part of a subset represented by a bit of syndrome 320, while a value of '0' can indicated that the bit of sense word 310 is not a part of the subset.

In one embodiment, the parity check equations each identify the logical state of the bits of sense word 310 that are part of each corresponding subset, sums those bits together and determines whether the result is even or odd. In other words, each parity check equations determines whether the number of bits of the sense word 310 that are part of a corresponding subset and have a certain logical state is even or odd. For example, parity check component 113 can determine whether a number of bits set to a logical value of '1' in a corresponding subset of the sense word 310 is even or odd. In one embodiment, if the number of bits set to a logical value of '1' in a corresponding subset of the sense word 310 is even, the parity check equation result can be '0' indicating that the parity check equation is satisfied. If the number of bits set to a logical value of '1' in a corresponding subset of the sense word 310 is odd, the parity check equation result can be '1' indicating that the parity check equation is unsatisfied. Each bit of syndrome 320 represents one of these parity check equation results. Thus, for SB0, since SWB0 is set to a value '1', SWB1 is set to a value of '0', SWB2 is set to a value of '1', and SWB4 is set to a value of '0', there are two bits of sense word 310 in the corresponding subset that are set to a value of '1'. Two bits is even, so the parity check equation result represented by SB0 is '0' indicating that the corresponding parity check equation is satisfied. For SB2, for example, since SWB0 is set to a value '1', SWB1 is set to a value of '0', SWB2 is set to a value of '1', and SWB6 is set to a value of '1', there are three bits of sense word 310 in the corresponding subset that are set to a value of '1'. Three bits is odd, so the parity check equation result represented by SB0 is '1' indicating that the corresponding parity check equation is unsatisfied.

Referring again to FIG. 2, at operation 225, a determination is made. For example, the processing logic determines whether the syndrome for the sense word satisfies an LDPC check criterion. In one embodiment, parity check component 113 determines whether all of the parity check equation results in the syndrome are in a satisfied state (e.g., have a value of '0'). In one embodiment, if all of the parity check equation results in the syndrome are in a satisfied state, parity check component 113 determines that the syndrome satisfies the LDPC check criterion. Conversely, if all of the parity check equation results in the syndrome are not in a satisfied state (e.g., one or more have a value of '1'), parity check component 113 determines that the syndrome does not satisfy the LDPC check criterion. If the syndrome for the sense word does satisfy the codeword criterion, parity check component 113 determines that there are no errors in the sense word and, at operation 230, returns the sense word to the requestor as the requested data.

If, however, the syndrome for the sense word does not satisfy the codeword criterion, the parity check component 113 determines that there are one or more errors in the sense word and, at operation 235, initiates an error correction process. In one embodiment, parity check component 113 determines whether a syndrome weight satisfies a threshold criterion. In response to determining that the current syndrome weight does not satisfy the threshold criterion, parity check component 113 can perform an iterative LDPC bit flip decoding process. After each iteration, parity check component 113 can determine the current syndrome and determine whether the current syndrome satisfies a threshold criterion corresponding to that iteration. In response to determining that the current syndrome weight satisfies the threshold criterion of a given iteration, however, parity check component 113 can end the bit flip decoding process without completing the remaining iterations, and initiate a second decoding process, such as Min-Sum decoding, for example. Additional details of the error correction process are described below with respect to FIG. 4.

Figure 4:
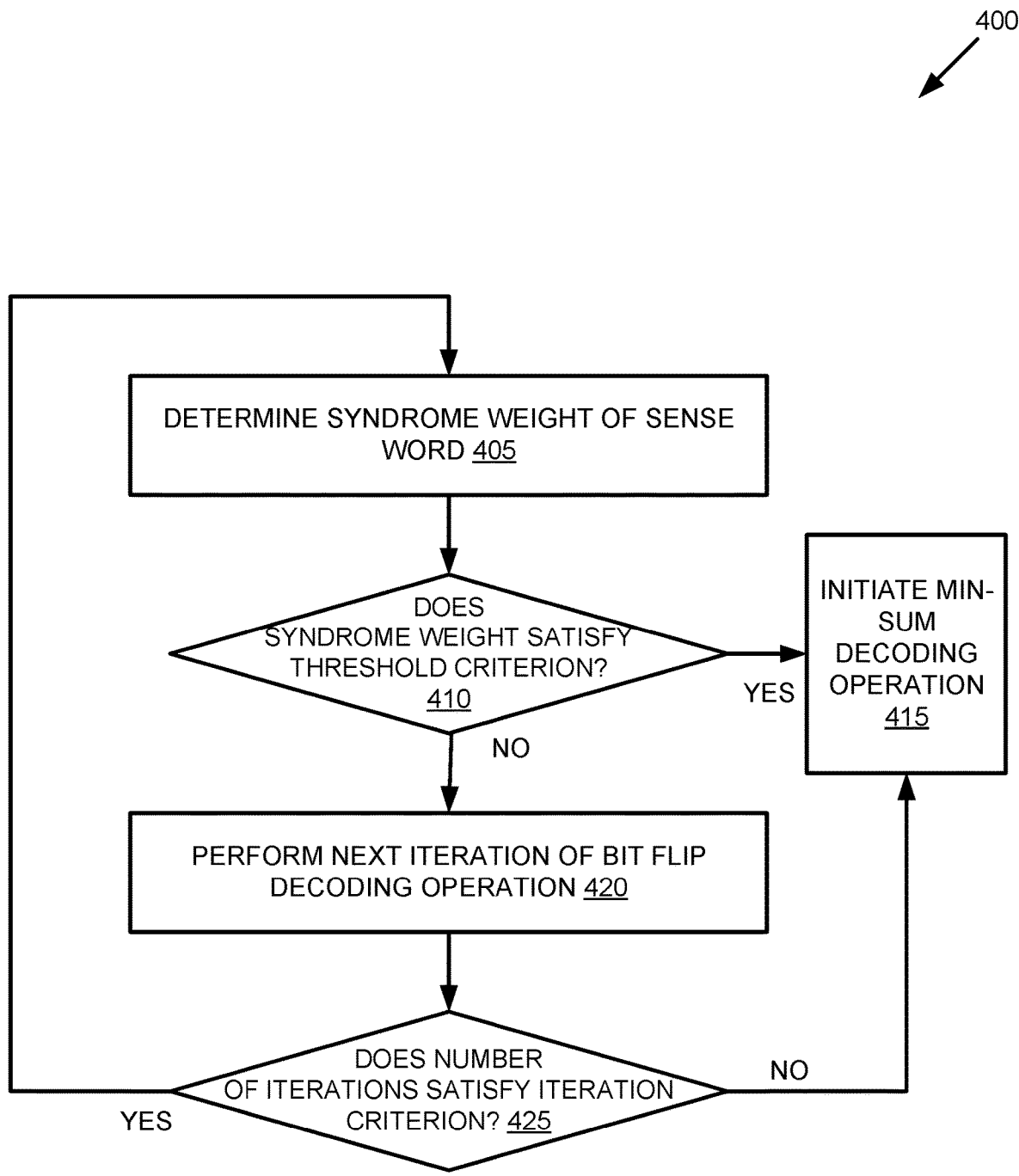
FIG. 4 is a flow diagram of an example method of early stopping of bit-flip low density parity check (LDPC) decoding based on syndrome weight in a memory sub-system in accordance with some embodiments of the present disclosure.

FIG. 4 is a flow diagram of an example method of early stopping of bit-flip low density parity check (LDPC) decoding based on syndrome weight in a memory sub-system in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by parity check component 113 of FIG. 1A. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, a metric is determined. For example, the processing logic (e.g., parity check component 113) can determine a syndrome weight for a sense word read from a memory device, such as memory device 130. As described above, a syndrome is a multi-bit value representing parity check equation results for the sense word. The syndrome weight is a number of the parity check equations that are unsatisfied, which can be represented in the syndrome by the number of non-zero symbols (e.g., the number of bits set to a logical value of '1').

At operation 410, a determination is made. For example, the processing logic can determine whether the syndrome weight for the sense word satisfies a respective threshold criterion associated with a next iteration of a first decoding operation. In one embodiment, the memory sub-system controller 115 includes multiple decoders each capable of performing different decoding operations. For example, memory sub-system controller 115 can include a first decoder, such as an iterative bit flip decoder, configured to perform a first decoding operation (e.g., an iterative bit flip decoding operation) and a second decoder, such as a Min-Sum decoder, configured to perform a second decoding operation (e.g., a Min-Sum decoding operation). In other embodiments, the first and/or second decoding operations can include other types of decoding operations. In one embodiment, the second decoding operation has a higher error correction capability than the first decoding operation. In one embodiment, the second decoding operation is less energy efficient than the first decoding operation.

In one embodiment, each respective threshold criterion comprises a respective threshold value that decreases with each subsequent iteration of the first decoding operation. In one embodiment, the syndrome weight for the sense word satisfies the respective threshold criterion associated with the next iteration of the first decoding operation when the syndrome weight is greater than or equal to the respective threshold value. For example, before any iterations of the first decoding operation are performed (i.e., when the next iteration would be the first iteration), parity check component 113 can determine the syndrome weight for the sense word and compare the syndrome weight to a first threshold value. In one embodiment, if the syndrome weight is greater than or equal to the first threshold value, the syndrome weight satisfies the threshold criterion. Thus, if the syndrome weight is less than the first threshold value, the syndrome weight does not satisfy the threshold criterion. Subsequently, if one or more iterations of the first decoding operation have already been performed, parity check component 113 can determine the syndrome weight for the sense word and compare the syndrome weight to a different threshold value. In general, the threshold value can decrease with each subsequent iteration since the syndrome weight is correlated with the number of errors in the sense word, if there are fewer iterations remaining before the maximum number of iterations of the first decoding operation, only a lower number of errors can be corrected. In one embodiment, each respective threshold can be determined, such as via an experimentation and/or testing process, and chosen at a point where the number of errors present in the sense word are likely to be able to be corrected given the number of iterations remaining in the first decoding operation. Depending on the embodiment, there can be a respective threshold associated with each iteration of the first decoding operation or only with a subset of the iterations of the first decoding operation.

Responsive to the syndrome weight for the sense word satisfying the respective threshold criterion, at operation 415, a second decoding operation is initiated. For example, upon determining that the syndrome weight is greater than or equal to a respective threshold, parity check component 113 can bypass the first decoding operation and initiate the second decoding operation for the sense word. Bypassing the first decoding operation can include not starting any iterations of the first decoding operation if the first decoding operation has not already been initiated, or alternatively, if the first decoding operation has already been started (i.e., if one or more iterations of the first decoding operation have already been performed), terminating the first decoding operation such that no additional iterations are performed. This can include terminating the first decoding operation before the maximum number of iterations associated with the first decoding operation has been reached.

Bit flip decoding is one example of an iterative low-density parity check (LDPC) correction process. To perform bit flip decoding, in one embodiment, parity check component 113 determines a number of parity check equations results that are in an unsatisfied state for each bit of the sense word, as well as a maximum number of parity check equation results that are in the unsatisfied state for any one bit of the sense word. In one embodiment, the energy associated with a given bit is represented by that number of unsatisfied parity check equations associated with the bit. In another embodiment, the energy can be the number of unsatisfied parity check equations plus the XOR of the current bit value with its original value. The parity check component 113 can then flip any bits in the sense word that have an energy that matches the maximum energy from the current or a previous iteration, and then move on to the next iteration.

To perform Min-Sum decoding, parity check component 113 can compute a different message from each sense word bit to each of its corresponding parity check equations, and vice versa, at each decoding iteration. This is in contrast to Bit Flip decoding, where only one value is calculated for each bit of the sense word and each parity check equation, which requires fewer resources (e.g., power or time, dependent on parallelism) per iteration. Thus, when the error count is low, Bit Flip decoding consumes fewer resources. In the Min-Sum algorithm, each code bit is considered a neighbor of all the parity check equations with which it is associated. During each iteration, each code bit and each parity check equation are sending messages to all of their neighbors. In one embodiment, those messages are computed according to a set of rules describe below. First, the decoding starts with each code bit sending its log likelihood ratio (LLR), as received from the channel (memory cell). Second, each check is computing each of its messages by considering its received messages excluding that from the code bit to whom the current message is intended. The sign of the sent message is equal to the product of the signs of the considered received messages, while the magnitude of the sent message is equal to the minimum among the magnitudes of the considered received messages. Third, each code bit is computing its total LLR value, defined by its channel LLR plus the sum of all of its received messages. Fourth, each code bit is sending the difference between its total LLR to the message received from the check to whom the current message is intended. Fifth, a syndrome is computed according to the total LLR values of all code bits, and if the syndrome is zero, decoding is concluded successfully. If the number of iterations equals the maximum limit, decoding is concluded with a failure. Otherwise the decoding process continues.

Responsive to the syndrome weight for the sense word not satisfying the respective threshold criterion, at operation 420, the first decoding operation proceeds. For example, upon determining that the syndrome weight is less than the respective threshold, parity check component 113 can perform the next iteration of the first decoding operation for the sense word. If the first decoding operation has not yet begun, parity check component 113 can initiate the first iteration. If one or more iterations have already been performed, parity check component 113 can initiate a subsequent iteration.

At operation 425, a determination is made. For example, the processing logic can determine whether a number of iterations performed in the first decoding operation satisfies an iteration criterion (e.g., is less than a threshold number of iterations). In one embodiment, parity check component 113 maintains a counter which is incremented after each iteration is performed. Parity check component 113 can compare the value of the counter to a threshold value (e.g., the maximum number of iterations) to determine if the iteration criterion is satisfied. If the number of iterations does satisfy the iteration criterion, the processing logic continues the first decoding operation by returning to operation 405 and determining the syndrome weight for the next iteration. If, however, the number of iterations performed does not satisfy the iteration criterion (e.g., the number of iterations meets or exceeds the threshold number of iterations), parity check component 113 can terminate the first decoding operation and initiate the second decoding operation at operation 415.

Figure 5:
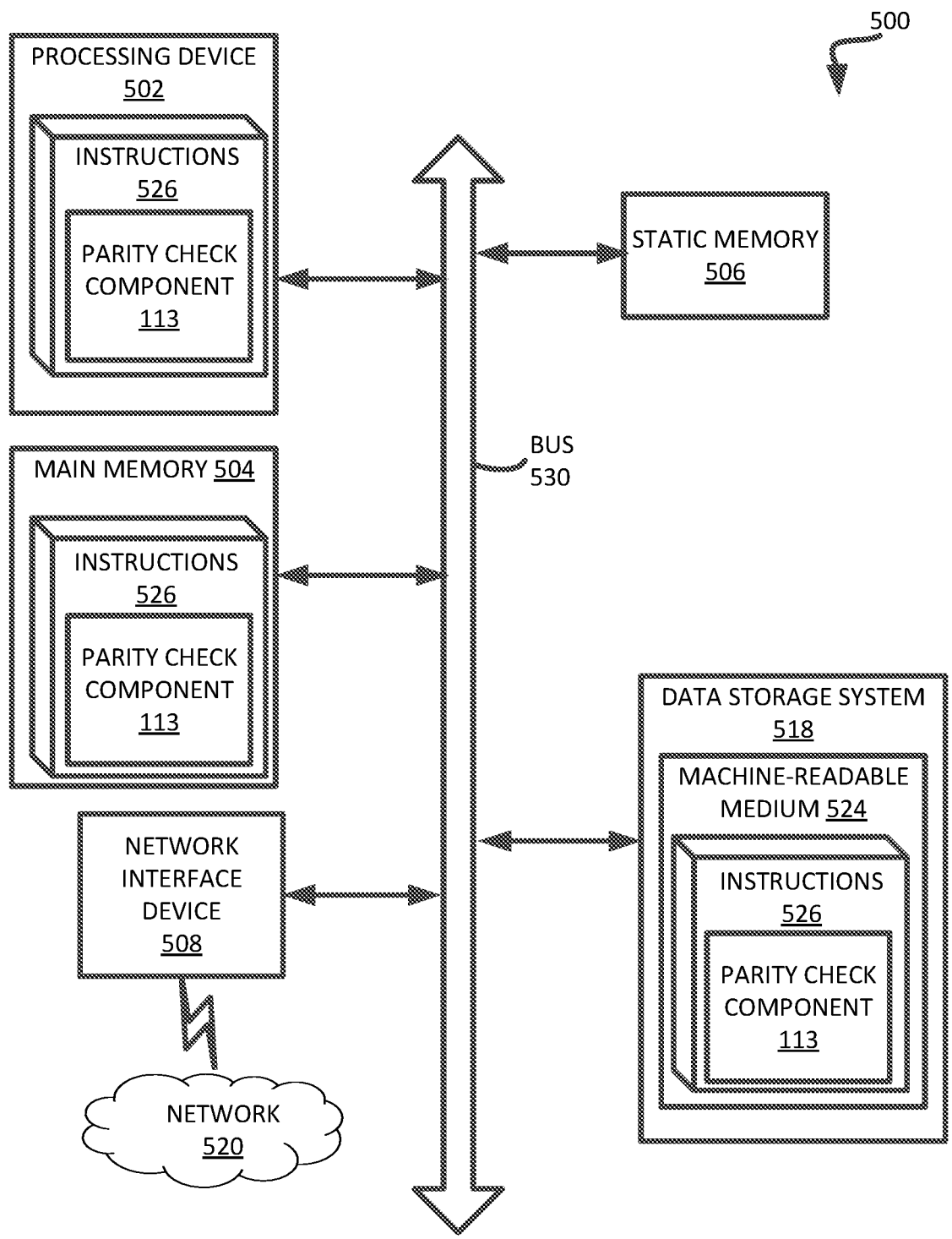
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the parity check component 113 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1A.

In one embodiment, the instructions 526 include instructions to implement functionality corresponding to the parity check component 113 of FIG. 1A). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
    a memory device; and
    a processing device, operatively coupled with the memory device, to perform operations comprising:
        determining a syndrome weight for a sense word read from the memory device;
        determining whether the syndrome weight for the sense word satisfies a respective threshold criterion associated with a next iteration of a first decoding operation, wherein each respective threshold criterion comprises a respective threshold value that decreases with each subsequent iteration of the first decoding operation and corresponds to a quantity of errors in the sense word that are correctable before a maximum number of iterations of the first decoding operation is reached, and wherein the syndrome weight for the sense word satisfies the respective threshold criterion associated with the next iteration of the first decoding operation when the syndrome weight is greater than or equal to the respective threshold value; and
        responsive to the syndrome weight for the sense word satisfying the respective threshold criterion, bypassing the first decoding operation and initiating a second decoding operation for the sense word, wherein the second decoding operation has a higher error correction capability than the first decoding operation.

2. The system of claim 1, wherein the second decoding operation is less energy efficient than the first decoding operation.

3. The system of claim 1, wherein the first decoding operation comprises an iterative bit flip decoding operation.

4. The system of claim 1, wherein the second decoding operation comprises a Min-Sum decoding operation.

5. The system of claim 1, wherein the processing device is to perform further operations comprising:
    responsive to the syndrome weight for the sense word not satisfying the threshold criterion, performing the next iteration of the first decoding operation for the sense word.

6. The system of claim 1, wherein the processing device is to perform further operations comprising:
    reading the sense word from the memory device;
    executing a plurality of parity check equations on corresponding subsets of the sense word to determine a plurality of parity check equation results; and
    determining the syndrome for the sense word using the plurality of parity check equation results, wherein the syndrome weight represents a number of bits in the syndrome set to a particular state.

7. The system of claim 6, wherein each of the plurality of parity check equations corresponds to a different subset of the sense word, and wherein each of the plurality of parity check equation results indicates whether a number of bits set to a value of '1' in a corresponding subset of the sense word is even or odd.

8. The system of claim 1, wherein the processing device is to perform further operations comprising:
    determining whether a number of iterations performed in the first decoding operation satisfies an iteration criterion; and
    in response to the number of iterations performed satisfying the iteration criterion, ending the first decoding operation and initiating the second decoding operation for the sense word.

9. A method comprising:
    determining a syndrome weight for a sense word read from a memory device;
    determining whether the syndrome weight for the sense word satisfies a respective threshold criterion associated with a next iteration of a first decoding operation, wherein each respective threshold criterion comprises a respective threshold value that decreases with each subsequent iteration of the first decoding operation and corresponds to a quantity of errors in the sense word that are correctable before a maximum number of iterations of the first decoding operation is reached, and wherein the syndrome weight for the sense word satisfies the respective threshold criterion associated with the next iteration of the first decoding operation when the syndrome weight is greater than or equal to the respective threshold value; and
    responsive to the syndrome weight for the sense word satisfying the respective threshold criterion, bypassing the first decoding operation and initiating a second decoding operation for the sense word, wherein the second decoding operation has a higher error correction capability than the first decoding operation.

10. The method of claim 9, wherein the second decoding operation is less energy efficient than the first decoding operation.

11. The method of claim 9, wherein the first decoding operation comprises an iterative bit flip decoding operation.

12. The method of claim 9, wherein the second decoding operation comprises a Min-Sum decoding operation.

13. The method of claim 9, further comprising:
    responsive to the syndrome weight for the sense word not satisfying the threshold criterion, performing the next iteration of the first decoding operation for the sense word.

14. The method of claim 9, further comprising:
    reading the sense word from the memory device;
    executing a plurality of parity check equations on corresponding subsets of the sense word to determine a plurality of parity check equation results; and
    determining the syndrome for the sense word using the plurality of parity check equation results, wherein the syndrome weight represents a number of bits in the syndrome set to a particular state.

15. The method of claim 14, wherein each of the plurality of parity check equations corresponds to a different subset of the sense word, and wherein each of the plurality of parity check equation results indicates whether a number of bits set to a value of '1' in a corresponding subset of the sense word is even or odd.

16. The method of claim 9, further comprising:
determining whether a number of iterations performed in the first decoding operation satisfies an iteration criterion; and
in response to the number of iterations performed satisfying the iteration criterion, ending the first decoding operation and initiating the second decoding operation for the sense word.

17. A non-transitory computer-readable storage medium comprising instructions that, when executed by a processing device, cause the processing device to perform operations comprising:
reading a sense word from a memory device;
executing a plurality of parity check equations on corresponding subsets of the sense word to determine a plurality of parity check equation results;
determining whether the plurality of parity check equation results indicates that a number of the parity check equations that are unsatisfied is greater than or equal to a threshold number, wherein the threshold number is associated with a next iteration of an ongoing iterative bit flip decoding operation, decreases with each subsequent iteration of the ongoing iterative bit flip decoding operation, and corresponds to a quantity of errors in the sense word that are correctable before a maximum number of iterations of the ongoing iterative bit flip operation is reached; and
responsive to the number of the parity check equations that are unsatisfied being greater than or equal to the threshold number, terminating the ongoing iterative bit flip decoding operation and initiating a Min-Sum decoding operation for the sense word.

18. The non-transitory computer-readable storage medium of claim 17, wherein the instructions cause the processing device to perform further operations comprising:
responsive to the number of the parity check equations that are unsatisfied being less than the threshold number, performing a next iteration of the ongoing iterative bit flip decoding operation for the sense word.

* * * * *